United States Patent
Okayasu

(10) Patent No.: US 6,590,405 B2
(45) Date of Patent: Jul. 8, 2003

(54) CMOS INTEGRATED CIRCUIT AND TIMING SIGNAL GENERATOR USING SAME

(75) Inventor: Toshiyuki Okayasu, Ohra-gun (JP)

(73) Assignee: Advantest, Corp, Tokyo (JP)

( * ) Notice: Subject to any disclaimer, the term of this patent is extended or adjusted under 35 U.S.C. 154(b) by 0 days.

(21) Appl. No.: 10/092,997

(22) Filed: Mar. 5, 2002

(65) Prior Publication Data

US 2002/0158652 A1 Oct. 31, 2002

Related U.S. Application Data

(63) Continuation-in-part of application No. 09/557,915, filed on Apr. 21, 2000, now Pat. No. 6,433,567.

(30) Foreign Application Priority Data

Apr. 21, 1999 (JP) ............................................ 11-113380

(51) Int. Cl.[7] .......................... G01R 31/02; G01R 1/04; H05B 1/00
(52) U.S. Cl. ...................... 324/760; 324/158.1; 219/209
(58) Field of Search ............... 324/760, 158.1, 324/754, 534; 219/209, 210, 497

(56) References Cited

U.S. PATENT DOCUMENTS

| 4,165,642 | A | | 8/1979 | Lipp |
| 4,497,998 | A | * | 2/1985 | West ........................... 219/209 |
| 4,734,641 | A | * | 3/1988 | Byrd, Jr. et al. .......... 324/158.1 |
| 5,309,090 | A | | 5/1994 | Lipp |
| 5,414,370 | A | * | 5/1995 | Hashinaga et al. .......... 324/760 |
| 5,760,599 | A | | 6/1998 | Ehiro |
| 5,886,564 | A | * | 3/1999 | Sato et al. ................ 324/158.1 |
| 5,911,897 | A | * | 6/1999 | Hamilton ...................... 219/209 |
| 5,917,331 | A | | 6/1999 | Persons |
| 5,999,008 | A | | 12/1999 | Currin et al. |
| 6,433,567 | B1 | * | 8/2002 | Okayasu ...................... 324/760 |

* cited by examiner

Primary Examiner—Kamand Cuneo
Assistant Examiner—Jermele Hollington
(74) Attorney, Agent, or Firm—Muramatsu & Associates

(57) ABSTRACT

A CMOS integrated circuit for use in a semiconductor test system generates timing signals of high timing resolution and accuracy for testing semiconductor devices. The CMOS integrated circuit includes a heater circuit for generating heat based on electric current flowing there through, and a heater control circuit for detecting an amount of total electric current flowing through a timing generator block for generating timing signals, and a control circuit block for providing timing data to the timing generator block, and the heater circuit, and providing a control voltage to the heater circuit based on the amount of current detected to control the current flowing through the heater circuit through a negative feedback loop.

12 Claims, 6 Drawing Sheets

US 6,590,405 B2

CMOS INTEGRATED CIRCUIT AND TIMING SIGNAL GENERATOR USING SAME his is a continuation-in-part of U.S. patent application Ser. No. 09/557,915 filed on Apr. 21, 2000, now U.S. Pat. No. 6,433,567.

FIELD OF THE INVENTION

This invention relates to a CMOS integrated circuit and a timing signal generator using the CMOS integrated circuit, and more particularly, to a CMOS integrated circuit and a timing signal generator using the CMOS integrated circuit to be used in a semiconductor test system for generating timing signals of high timing resolution and accuracy for testing semiconductor devices.

BACKGROUND OF THE INVENTION

In testing semiconductor devices such as ICs and LSIs by a semiconductor test system, such as an IC tester, a semiconductor IC device to be tested is provided with test signals or test patterns produced by a semiconductor test system at its appropriate pins at predetermined test timings. The semiconductor test system receives output signals from the IC device under test in response to the test signals. The output signals are sampled by strobe signals with predetermined timings to be compared with expected data to determine whether the IC device performs intended functions correctly.

To achieve accurate test results, the timings of the test signals and strobe signals must be adjustable with high timing resolution and accuracy. In a semiconductor test system, various timings of the test signals and strobe signals are generated and controlled by a timing generator. Typically, such a timing generator produces various timings (delay times) using signal propagation delay times of CMOS integrated circuits.

An example of configuration in such a timing generator is shown in FIGS. 4–7. Typically, such a timing generator is configured in a MOSFET (metal oxide semiconductor filed effect transistor) integrated circuit, especially, a CMOS (complementary MOS) integrated circuit. As shown in FIG. 4, an example of timing generator using CMOS integrated circuits is comprised of an electric power source 10, a control logic block 20, and a timing generator block 30. The electric power source 10 is a constant voltage source supplying electric currents to the timing generator block 30. In this example, a voltage source terminal VDD is connected to the ground (GND) and a voltage source terminal VSS is provided with a negative voltage.

The control logic block 20 is a logic circuit that produces timing data in synchronism with a clock signal for controlling delay times in variable delay circuits 31 in the timing generator block 30. The timing generator block 30 includes a plurality of variable delay circuits 31 to produce various timings in response to the timing data from the control logic block 20.

Typically, the timing generator block 30 is formed of a coarse delay circuit and a fine delay circuit such as shown in FIG. 7. For example, the coarse delay circuit produces a delay time which is an integer multiple of one clock signal period while the fine delay circuit produces a delay time which is a fraction of the one clock signal period. Thus, in this example, the variable delay circuit 31 of FIG. 4 corresponds to the combination of the coarse delay circuit and the fine delay circuit of FIG. 7.

The upper part of FIG. 7 is the coarse delay circuit and the lower part thereof is the fine delay control circuit. In the example of FIG. 7, the coarse delay circuit is formed of a counter 71, a register 72, a comparator 73, a flip-flop 74 and an AND gate 76. In the coarse delay circuit, the counter 71 is reset by a tester rate signal and the coarse delay data in the timing data from the control block 20 is loaded in the register 72. The counter 71 counts the clock signal. The counted data of the counter 71 is compared with the coarse delay data stored in the register 72 by the comparator 73.

When both data match with each other, the comparator 73 produces a coincidence signal which is re-timed by the flip-flop 74 and the AND gate 76. Thus, the output of the AND gate 76 shows a delay time which is an integer multiple of the clock cycle. The delayed output signal from the AND gate 76 is provided with a delay time which is smaller than the clock cycle by the fine delay circuit in the lower part of FIG. 7.

The fine delay circuit is configured by a plurality of variable delay circuits for producing weighted small delay times. In the example of FIG. 7, the fine delay control unit includes a delay unit 77 for generating a delay time equal to a ½ cycle of the clock signal and a delay unit 78 for generating a delay time equal to a ¼ cycle of the clock signal. The delay unit 77 is formed of AND gates 81 and 82, a delay element 83, and an OR gate 84. Similarly, the delay circuit 78 is formed of AND gates 85 and 86, a delay element 87, and an OR gate 88.

The delay elements 83 and 87 respectively produce the above noted delay times which are ½ cycle and ¼ cycle, respectively, of the clock signal. Such delay times are created by combinations of signal propagation delay times of a series connected CMOS transistors or gates forming the delay elements 83 and 87. In other words, the timing generator of FIG. 4 and the timing generator block of FIG. 7 are typically formed of a CMOS integrated circuit, the delay elements 83 and 87 in the fine delay circuit operates in an analog fashion while the other parts thereof operate in a digital fashion.

As shown in the circuit configuration of FIG. 7, by the fine timing data provided to the AND gates, it is determine as to whether or not the input signal to the delay circuit is introduced to the signal path having the delay element for adding the delay time. As a consequence, at the output of the timing generator block of FIG. 7, a timing signal having a high timing resolution is produced. In an actual application to a semiconductor test system, a large number of such delay circuits are employed to produce a fine delay time having timing resolution of, for example, ¹⁄₃₂ cycle of the reference clock.

As noted above, each delay element is formed of a CMOS integrated circuit having a large number of CMOS transistors or CMOS gates series connected to one another. Accordingly, the delay time produced by such a delay element tends to be subject to voltage changes or temperature changes, resulting in the timing instability. For example, such temperature changes caused by the environmental changes or the heat dissipated or power consumption by the CMOS integrated circuit itself.

Therefore, in order to obtain the high timing accuracy, it is necessary to remove the factors which cause fluctuations in the transmission delay time in the timing generator block 30. The temperature variations in the CMOS integrated circuit chip caused by ambient temperature and/or the chip's self-generated heat as well as the source voltage variation account for most of the fluctuations in the delay timings in the timing generator block 30. The ambient temperature can be stabilized by using an improved cooling means such as a constant temperature chamber or oven. The source voltage can be stabilized by using a high-accuracy voltage regulator that senses the voltage supplied to the CMOS integrated circuit chip and regulate the same to be constant.

However, the temperature changes based on the self-dissipated heat by the CMOS integrated circuit is not easily removable. In a CMOS integrated circuit, electric current flows in an impulse manner during the transition period of each CMOS gate or transistor. In a steady state, after changing the states in the complementary MOS transistors, almost no electric current flows therein. Such transitions occur when a pulse signal propagating through the CMOS integrated circuit. Therefore, power consumption or heat dissipated by the CMOS integrated circuit is a function of the frequency or repetition rate of the pulse signal applied to the CMOS integrated circuit.

FIG. 5 shows the relationship between the signal repetition rate (frequency) in the CMOS integrated circuit and the heat dissipated (power consumed) by the CMOS integrated circuit. The repetition rate is the number of changes in the logic state per unit time when the CMOS integrated circuit is in operation. As indicated by the dotted line of FIG. 5, the self-dissipated heat by an ECL integrated circuit chip is constant regardless of the signal repetition rate. However, as indicated by the solid line of FIG. 5, the self-dissipated heat by the CMOS integrated circuit chip increases as the increase of the signal repetition rate.

Thus, the variation of the signal repetition rate in the CMOS integrated circuit results in the variation in the amount of heat dissipation by the CMOS integrated circuit, which affects the chip temperature and transmission delay time. For example, as shown in FIG. 6, as the chip temperature of the CMOS integrated circuit increases, the transmission delay time increases as well.

Hence, the variation of the signal repetition rate of the CMOS integrated circuit leads to chip temperature variation, and varies the transmission delay time. As a result, timing drifts or timing jitters are involved in the timing signal output. In a semiconductor test system, in order to accommodate a variety of test specifications of semiconductor devices to be tested, test rates and timings of test signals to be generated must be freely adjustable.

For doing this, it is designed that output timings of the timing generator can be changed freely for each test cycle. For example, a timing signal is output at the time period of 4 ns for a certain test cycle while the time period of 100 ns for another test cycle. As a result, the repetition rate of the signal passing through the CMOS integrated circuit in the timing generator varies accordingly, resulting in the variation in the CMOS chip temperature.

To overcome this problem, an example of conventional technology includes a dummy delay circuit in the timing generator block 30 for each variable delay circuit 31. Based on the number of changes in the logic state shown in the timing data from the control logic block 20, the dummy delay circuit changes the state, thereby maintaining the constant overall signal repetition rate in the timing generator block in real time to a certain degree. However, since the signal repetition rate of the control logic block 20 is not constant, the temperature of the control logic block changes due to the variation of the operation frequency. The temperature change is propagated to the timing generator block 30, resulting in the timing drifts or timing jitters in the output signal.

As explained in the foregoing, the variation of signal repetition rate in the CMOS integrated circuit in the timing generator causes timing drifts or timing jitters in the timing signal output. Thus, there is a need for a timing generator using CMOS integrated circuits having improved timing resolution and accuracy which is not affected by the changes in the signal repetition rate therein.

SUMMARY OF THE INVENTION

Therefore, it is an object of the present invention to provide a CMOS integrated circuit for a timing generator used in a semiconductor test system which can minimize timing drifts or timing jitters of the timing signal output even when the signal repetition rate in the CMOS integrated circuit forming the timing generator changes.

It is another object of the present invention to provide a CMOS integrated circuit and a timing generator using the CMOS integrated circuit to be used in a semiconductor test system in which an overall power consumption is regulated to be constant without regard to the changes in the signal repetition rate in the CMOS integrated circuit.

In order to achieve the above object, the first aspect of the present invention is a CMOS integrated circuit which functions as a timing signal generator that maintains constant power consumption in the CMOS integrated circuit characterized as having a heater circuit for controlling an overall electric current flowing there through by a control voltage, and a heater control circuit for detecting an amount of overall electric current flowing through a timing generator block, a control circuit block, and the heater circuit and for providing a control voltage to the heater circuit based on the amount of the overall electric current detected to control the current flowing through the heater circuit through a negative feedback loop.

In the further aspect, the heater control circuit includes a current detection resistor for detecting the overall electric current, a differential amplifier provided with a voltage across the current detection resistor at its one input, and a reference voltage at its another input. The CMOS integrated circuit further includes a voltage regulator for controlling source voltages to the CMOS integrated circuit to be a constant value by monitoring at least one of the source voltages.

The CMOS integrated circuit implementing the timing generator of the present invention has to be tested before actually being installed in a semiconductor test system. For testing the CMOS integrated circuit of the present invention having the heater circuit, such as through an IDDQ test method, the heater circuit has a control gate to turn off the heater circuit.

According to the present invention, even when the signal repetition rate in the CMOS integrated circuit varies, the source voltages VDD and VSS provided to the CMOS chip are controlled to be constant and the electric current ISS is also controlled to be constant. Because the power consumption of CMOS chip as a whole remains unchanged and the temperature of the chip also remains constant, the transmission delay time in the CMOS circuit is constant even when the signal repetition rate changes. Hence, no timing drifts or timing jitters will be involved at the timing signal outputs, thereby achieving high timing accuracy. The CMOS circuit implementing the timing generator of the present invention can be tested through an IDDQ test, before being incorporated in the semiconductor test system.

DETAILED DESCRIPTION OF THE INVENTION

Figure 1A:
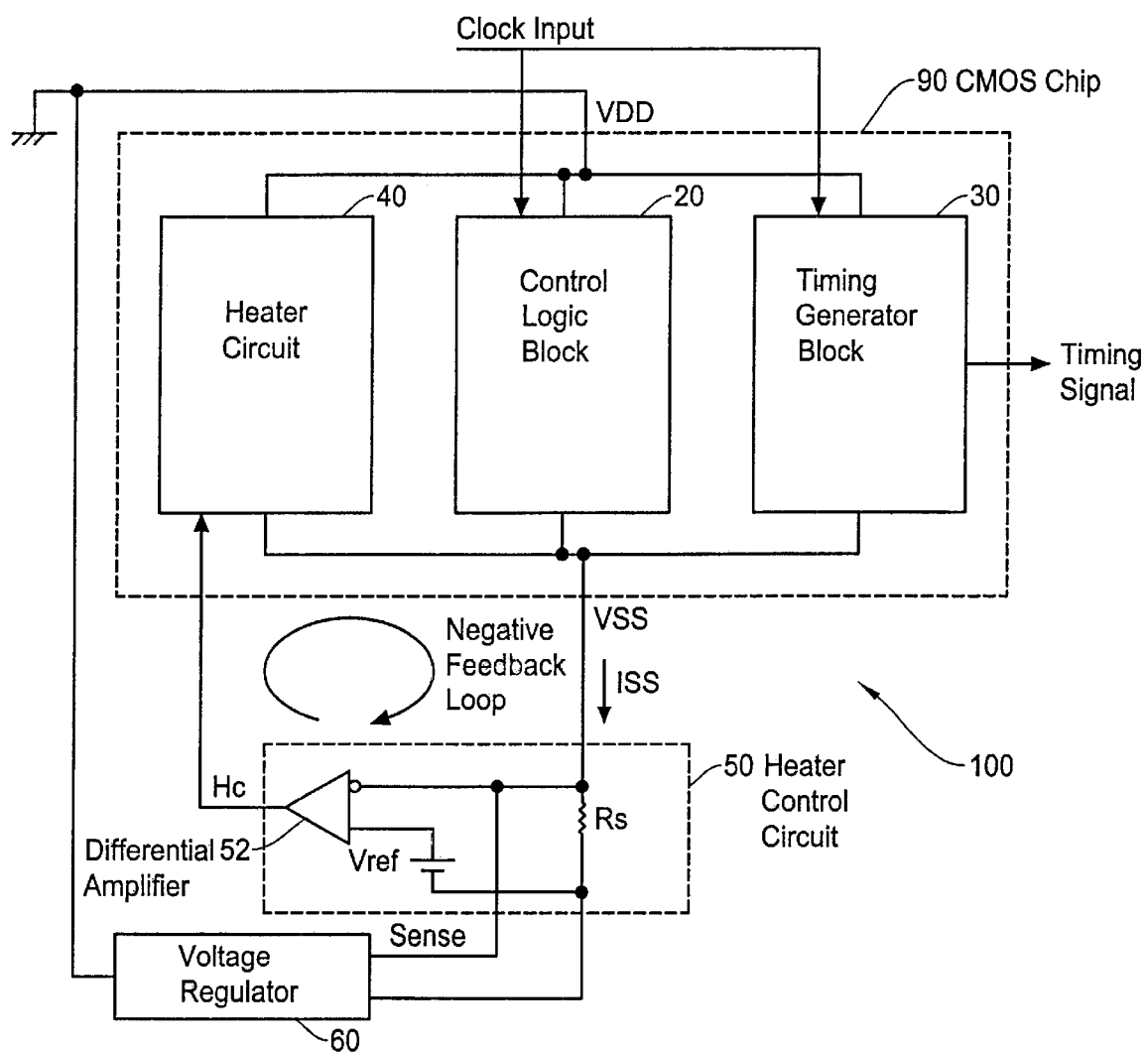
FIG. 1A is a schematic block diagram showing an example of CMOS integrated circuit for generating timing signals in the present invention.
Figure 1B:
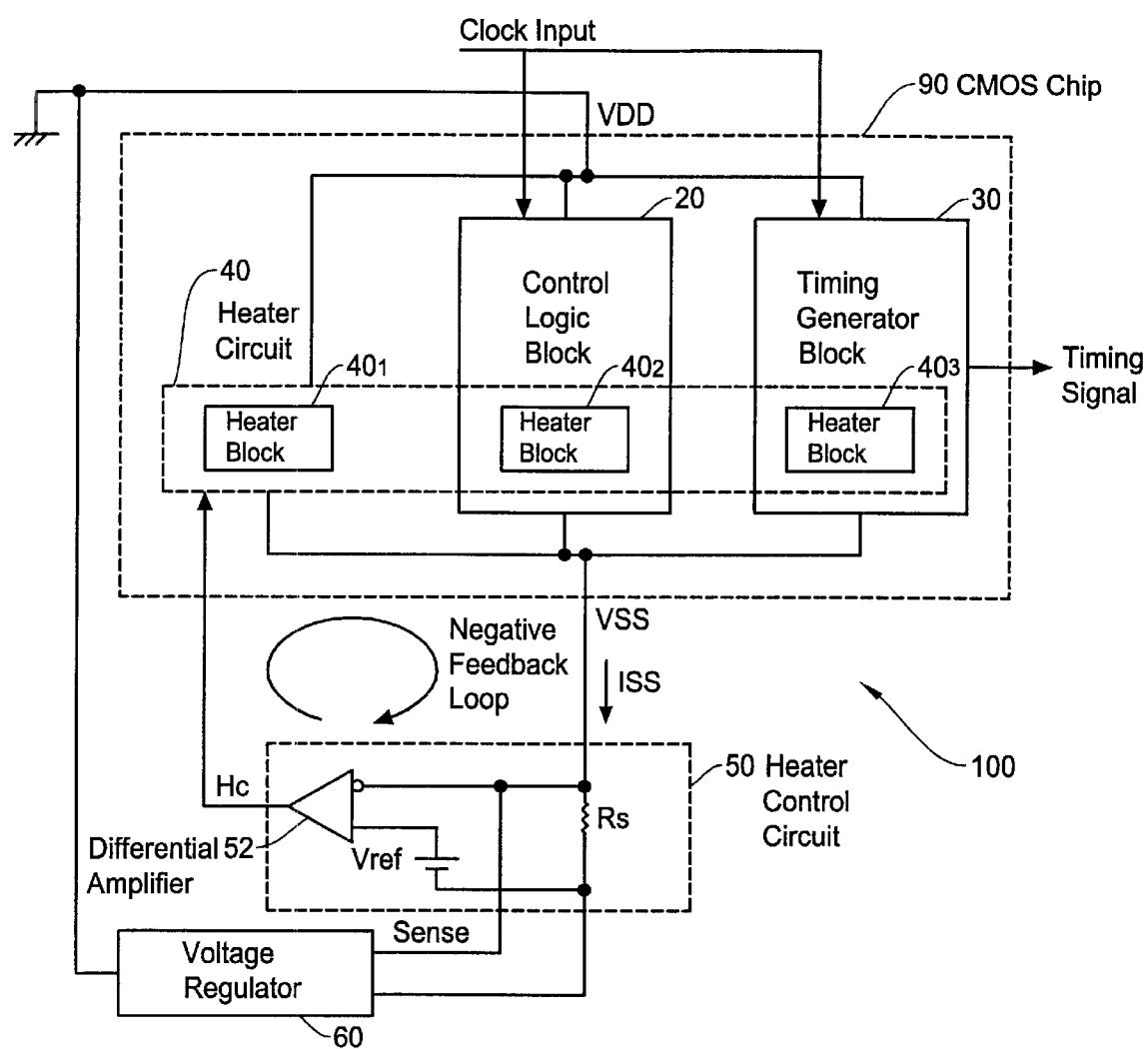
FIG. 1B is a schematic block diagram showing another example of CMOS integrated circuit for generating timing signals in the present invention.
Figure 2:
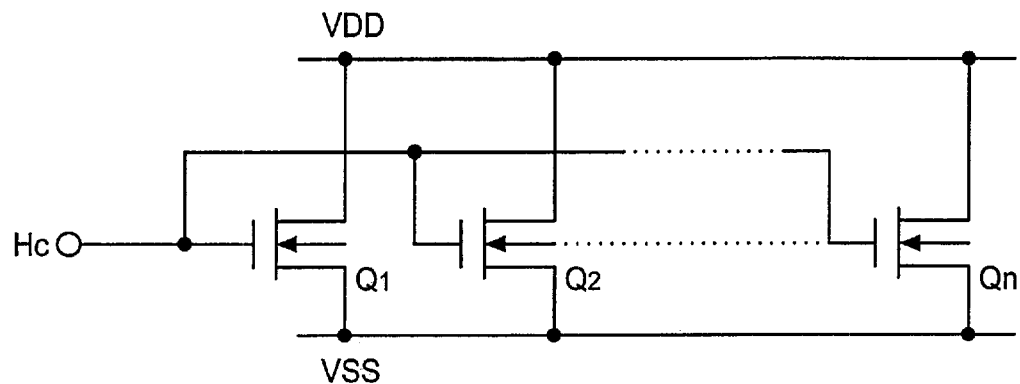
FIG. 2 is a basic circuit diagram showing an example of heater cell formed of MOSFETs to be used in the heater circuit of FIGS. 1A and 1B.
Figure 3:
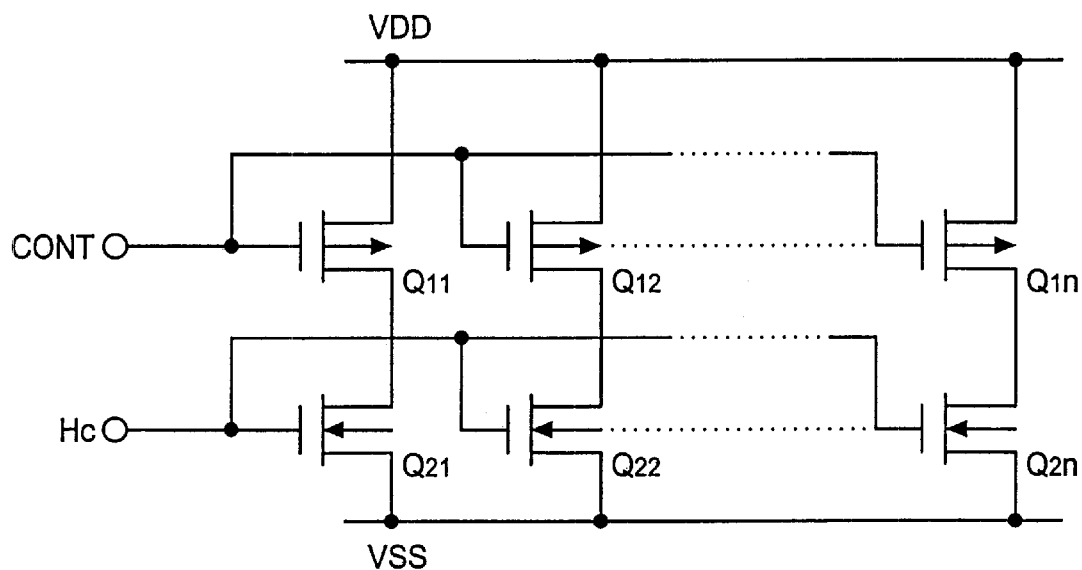
FIG. 3 is a schematic diagram showing another example of heater cell formed of MOSFETs having an electric current cut-off control to be used in the heater circuit of FIGS. 1A and 1B.

FIGS. 1–3 show the CMOS integrated circuit for generating timing signals in the present invention. FIGS. 1A and 1B show basic structures of the CMOS integrated circuit for generating timing signals in accordance with the present invention. FIG. 2 shows an example of heater circuit used in the CMOS integrated circuit 100 of FIGS. 1A and 1B. FIG. 3 shows another example of heater circuit having an electric current cut-off control.

Figure 4:
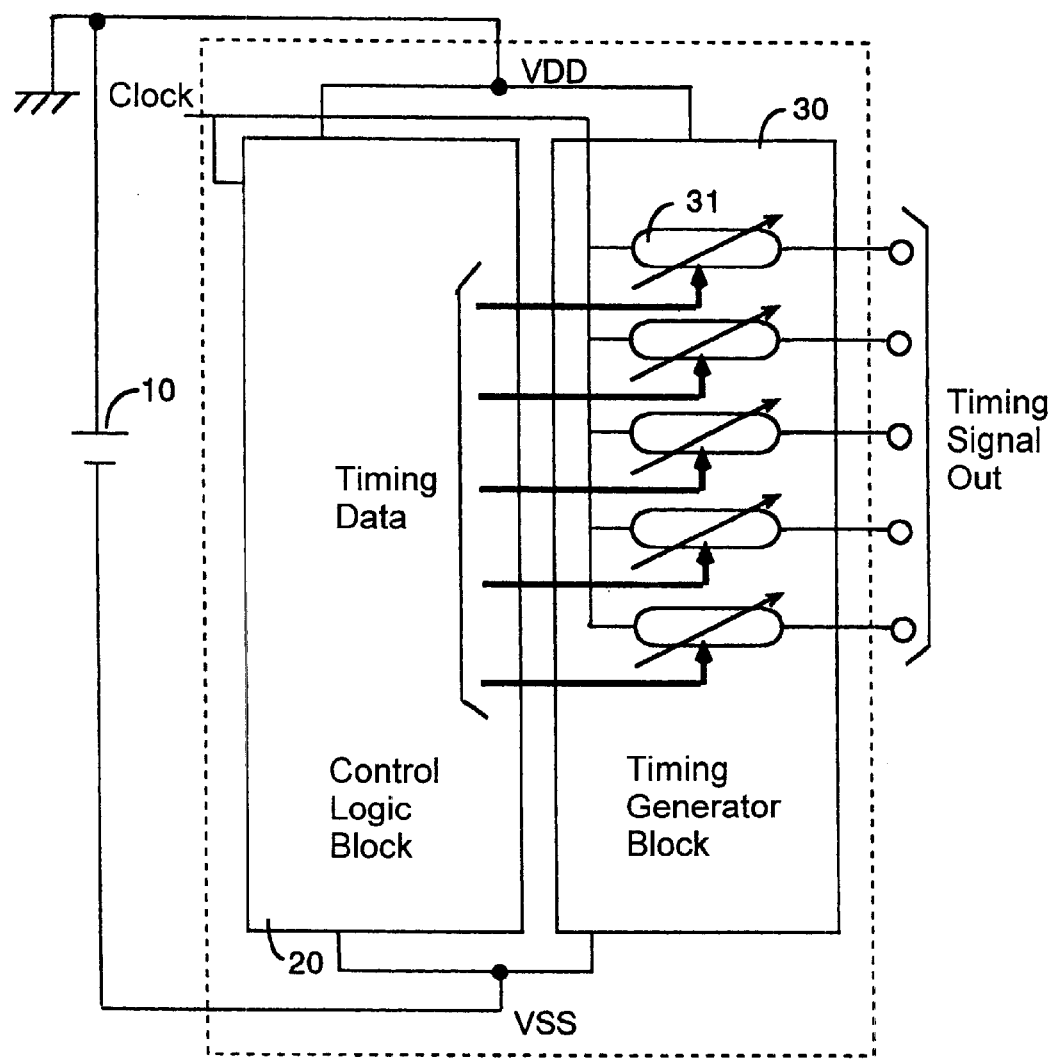
FIG. 4 is a block diagram showing an example of basic configuration in the CMOS integrated circuit in the conventional technology.
Figure 5:
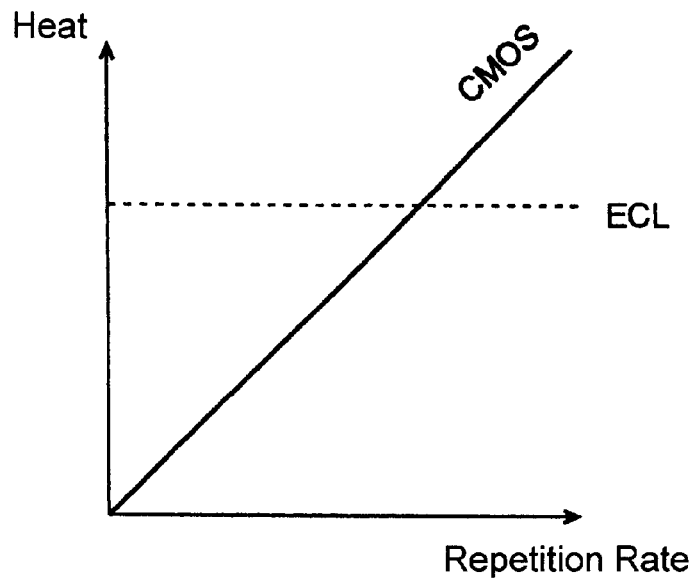
FIG. 5 is a graph showing the relationship between the signal repetition rate in integrated circuits and heat dissipated by the integrated circuits.
Figure 6:
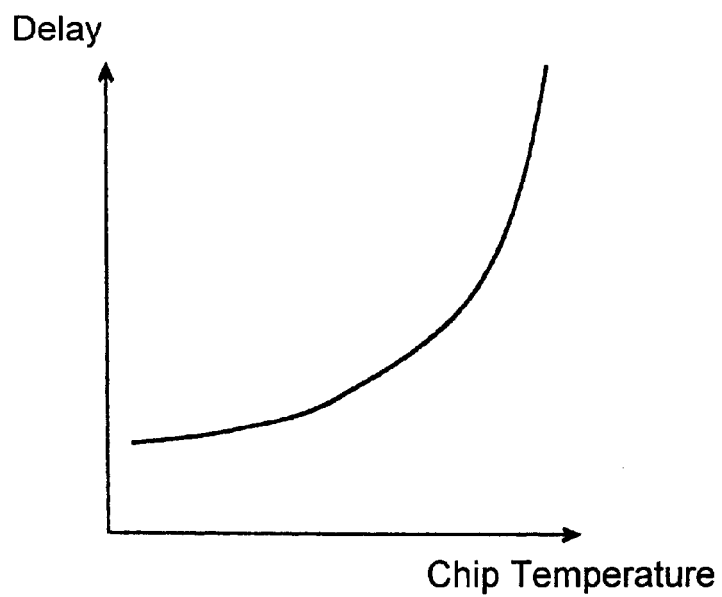
FIG. 6 is a graph showing the relationship between the chip temperature of the CMOS integrated circuit and the signal propagation delay time.
Figure 7:
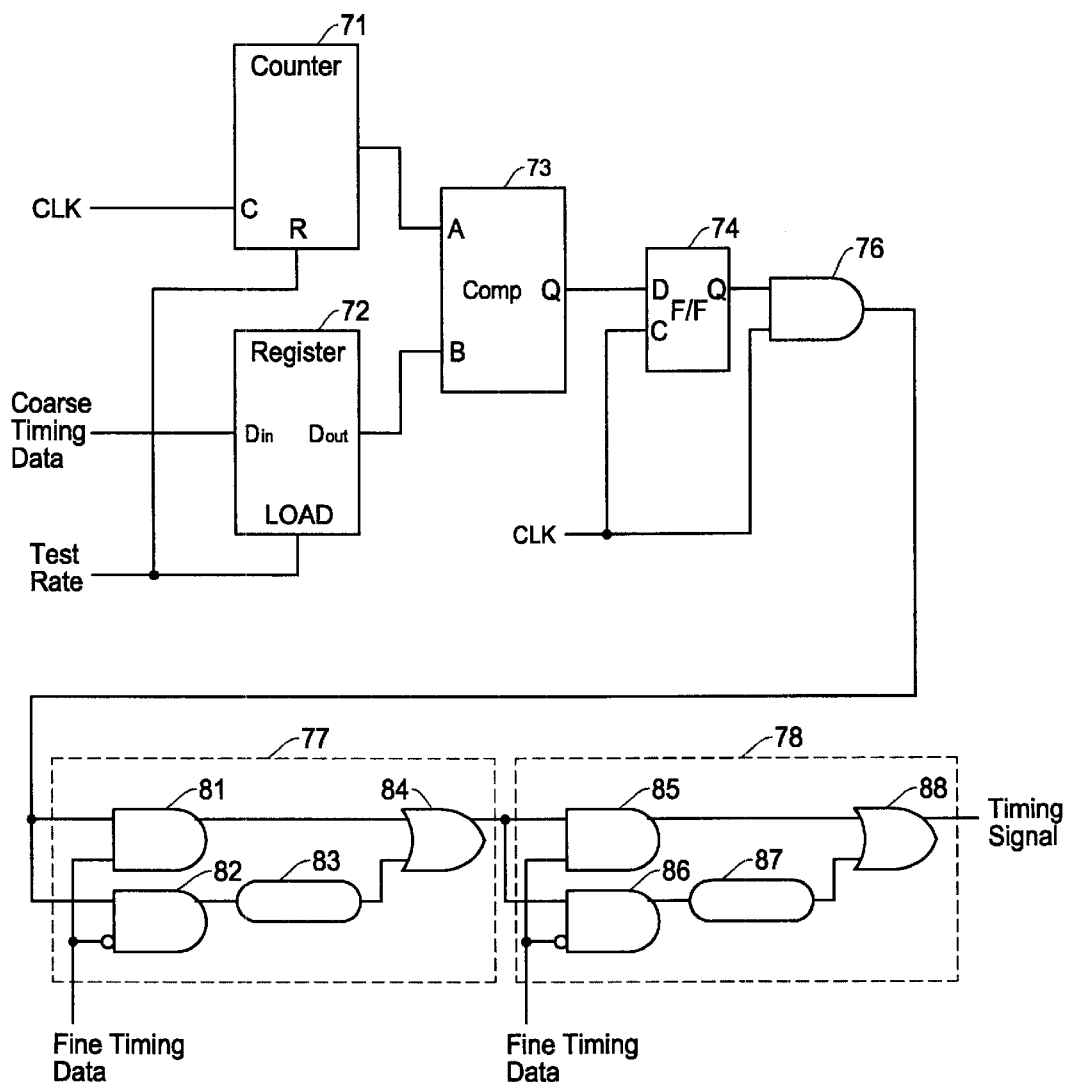
FIG. 7 is a block diagram showing an example of circuit configuration in the timing generator block in the conventional technology.

In the example of FIG. 1A, the CMOS integrated circuit 100 for generating timing signals is comprised of a control logic block 20, a timing generator block 30, a heater circuit 40, a heater control circuit 50, and a voltage regulator 60. Preferably, the control logic block 20, timing generator block 30 and heater circuit 40 are formed commonly in a CMOS chip 90. In this configuration, the control circuit block 20 and the timing generator block 30 are identical to those in the conventional example of FIG. 4, thus, no further description about these blocks is given here.

The heater circuit 40 is to generate heat and is comprised of, for example, a plurality of heater cells each having an N-type MOSFET, such as an N-type CMOS, as shown in FIG. 2. Preferably, each heater cell in the heater circuit 40 is arranged so as to be evenly distributed to the whole chip of the CMOS integrated circuit. For example, in FIG. 1B, the heater circuit 40 is comprised of a plurality of heater blocks $40_1$–$40_3$ all of which are within the CMOS chip 90. The heater block $40_2$ is provided in the control logic 20 and the heater block $40_3$ is provided in the timing generator block 30. The heater blocks $40_1$–$40_3$ are controlled at the same time.

The drain and source of the MOSFET (metal oxide semiconductor filed effect transistor) are connected to source voltages VDD and VSS, respectively, and a control voltage Hc from the heater control circuit 50 is supplied to the gate of the MOSFET as shown in FIGS. 2 and 3. The gate control voltage Hc controls the amount of current flowing through each heater cell in the heater circuit 40. In the example of FIG. 12, the heater blocks $40_1$–$40_3$ are controlled in parallel at the same time by the control voltage Hc.

As shown in FIGS. 1A and 1B, the heater control circuit 50 is comprised of a resistor Rs with low resistance value, a reference voltage Vref, and a differential amplifier 52. The resistor Rs is to detect an overall current ISS which is a sum of currents flowing through the heater circuit 40, the control circuit block 20, and the timing generator block 30 by a voltage drop across the resister Rs. The voltage across the resistor Rs is supplied to one input of the differential amplifier 52 while the reference voltage Vref is supplied to the other input of the differential amplifier 52. The heater control circuit 50 forms a negative feedback loop as shown by an arrow in FIGS. 1A and 1B to control the current ISS to be constant by supplying a heater control voltage Hc to the heater circuit 40. The following equation is obtained by this negative feedback control.

$$ISS \times R = Vref \tag{1}$$

In the arrangement of FIGS. 1A and 1B, for example, when the signal repetition rate in the control logic block 20 and timing generator block 30 increases, the electric current ISS also increases. Then the heater control voltage Hc goes higher so that the current flowing through the heater circuit 40 decreases, thereby maintaining the overall current ISS constant. On the other hand, when the signal repetition rate in the control circuit block 20 and the timing generator block 30 decreases, the source current ISS also decreases. Thus, heater control voltage Hc is lowered so that the current flowing through the heater circuit 40 increases, thereby maintaining the overall current ISS constant.

The voltage regulator 60 is a constant voltage source for supplying a source voltage VSS to the CMOS integrated circuit 90. In this example, the source voltage VSS is a negative voltage relative to the source voltage VDD which is a ground potential. The voltage regulator 60 detects (sense) the voltage VSS of the timing generator circuit, and controls the negative voltage VSS to be equal to a predetermined voltage difference from the reference voltage Vref.

Thus, even when the signal repetition rate in the CMOS integrated circuit changes, the source voltages VDD and VSS provided to the CMOS integrated circuit chip and the overall current ISS are controlled to be constant. Hence, the power consumption by the overall chip becomes constant, thereby maintaining the chip temperature constant.

Since the chip temperature is regulated to be constant, the transmission delay time in the timing generator block 30 is not affected by the variation of the signal repetition rate in the CMOS integrated circuit 90. Therefore, timing signals of high accuracy can be generated by the timing generator block 30 because the timing drifts or timing jitters are not involved in the timing signals even when the signal repetition rate in the CMOS integrated circuit changes.

When a semiconductor device under test (DUT) is a CMOS integrated circuit, one of the methods for testing such DUTs is called an IDDQ test in which a quiescent source current of the DUT is measured. Since good transistors in a CMOS circuit draw no current other than diode reverse current when the CMOS transistor is not switching. Thus by measuring the quiescent current, defects in the CMOS integrated circuit can be detected.

Preferably, the CMOS integrated circuit of the present invention is also tested before being installed in the semiconductor test system. When performing the IDDQ test on the CMOS integrated circuit of the present invention, the heater circuit 40 has to be set to an inactive state so that only quiescent current of the CMOS integrated circuit is to be measured. The heater circuit of FIG. 3 is designed so that the overall CMOS integrated circuit can be tested by the IDDQ method.

In the heater circuit of FIG. 3, each heater cell is comprised of an N-type CMOS transistor ($Q_{21}$–$Q_{2n}$) and a P-type CMOS transistor ($Q_{11}$–$Q_{1n}$). The heater control circuit 50 provides the heater control voltage Hc to the gate of each of the N-type CMOS transistors $Q_{21}$–$Q_{2n}$. The gate of each of the P-type CMOS transistors $Q_{11}$–$Q_{1n}$ is provided with a control voltage CONT as a current cut-off voltage. In other words, the gate of each of the P-type CMOS transistors $Q_{11}$–$Q_{1n}$ functions as a terminal for receiving a current cut-off voltage to inactivate the heater circuit. Such a control voltage CONT can be produced by the timing generator block which typically has a large number of registers for controlling its operation.

When the control voltage CONT equals to the source voltage VDD, an electric current to the heater cell is cut-off, and when the control voltage CONT equals to the source voltage VSS, the electric current flows through the heater cell in the heater circuit 40. Thus, in the case where the IDDQ test is performed, the control voltage CONT is set equal to the source voltage VDD so that the electric current flowing in the heater current 40 is shut down.

In the implementation described above, the heater cells of the heater circuit 40 are distributed evenly throughout the whole CMOS chip. However, the heater cells may be omitted in certain locations when sufficient temperature compensation is achieved by dummy delay circuits for the variable delay circuit 31. For example, the variation in the signal repetition rate can be compensated to a certain degree in real time by monitoring the number of output state changes in the control logic block shown in the timing data and the dummy delay circuits are driven in response to the number of output state changes. In other words, in such a situation, the heater cells of the heater circuit 40 may be distributed only to the control logic block 20.

In the implementation described above, the heater circuit in FIGS. 2 and 3 is comprised of MOSFETs such as CMOS transistors. However, the present invention is not limited to such a particular type of semiconductor circuit, and other electric current control devices controlled by a control voltage may also be used.

Further in the implementation described above, all of the components of the present invention are configured within a CMOS integrated circuit. However, it is also possible that some components can be arranged outside of the CMOS integrated circuit, although a CMOS integrated circuit is used as a timing signal generator as a whole. For example, the voltage regulator 60 may be arranged outside of the CMOS integrated circuit 90, while the control logic block 20, the timing generator block 30, the heater circuit 40, and the heater control circuit 50 are arranged inside of the CMOS integrated circuit 90 to constitute the timing signal generator as a whole.

As another example, the heater control circuit 50 and the voltage regulator 60 may be arranged outside of the CMOS integrated circuit 90, while the control circuit block 20, the timing generator block 30, and the heater circuit 40 are arranged inside of the CMOS integrated circuit 90 to constitute the timing signal generator.

As has been explained in the forgoing, even when the signal repetition rate in the CMOS integrated circuit varies, the source voltages VDD and VSS provided to the CMOS chip are controlled to be constant and the electric current ISS is also controlled to be constant. Because the power consumption of CMOS chip as a whole remains unchanged and the temperature of the chip also remains constant, the transmission delay time in the CMOS circuit is constant even when the signal repetition rate changes. Hence, no timing drifts or timing jitters will be involved at the timing signal outputs, thereby achieving high timing accuracy.

Although only a preferred embodiment is specifically illustrated and described herein, it will be appreciated that many modifications and variations of the present invention are possible in light of the above teachings and within the purview of the appended claims without departing the spirit and intended scope of the invention.

What is claimed is:

1. An integrated circuit forming a timing signal generator, comprising:

a heater circuit for generating heat by flowing electric current there through in response to a control voltage; and a heater control circuit for detecting a sum of electric current flowing through a timing generator block, a control logic block, and the heater circuit and providing said control voltage to the heater circuit based on the sum of electric current detected to control an amount of heat generated by the heater circuit through a negative feedback loop;

wherein said heater circuit is formed of series connected semiconductor components each having a terminal for receiving said control voltage to generate said heat and another terminal for receiving a current cut-off voltage to cut-off electric current to the heater circuit when quiescent source current of the integrated circuit is tested.

2. An integrated circuit as defined in claim 1, further comprising a voltage regulator for regulating a source voltage supplied to the integrated circuit to be a constant value.

3. An integrated circuit as defined in claim 1, wherein each of said semiconductor components forming the heater circuit is a MOSFET (Metal Oxide Semiconductor Field Effect Transistor).

4. An integrated circuit as defined in claim 1, wherein each of said semiconductor components forming the heater circuit is a CMOS (complementary MOS) transistor.

5. An integrated circuit as defined in claim 1, wherein the heater circuit includes a plurality of heater blocks which are evenly distributed throughout a whole chip of the integrated circuit where each heater block includes said semiconductor components.

6. An integrated circuit as defined in claim 1, wherein said semiconductor components of the heater circuit are distributed only within the control logic block.

7. An integrated circuit as defined in claim 1, wherein the heater control circuit includes a current detection resistor for detecting the sum of the electric current flowing there through, and a differential amplifier provided with a voltage across the current detection resistor at its one input and a reference voltage at its another input, wherein said differential amplifier producing said control voltage supplied to the heater circuit.

8. A timing signal generator for generating timing signals, comprising:

a timing generator block for producing a timing signal of a specified delay timing by adding the specified delay timing to an input clock signal;

a control logic block for providing timing data specifying said delay timing to the timing generator block for controlling the delay timing of the timing signal;

a heater circuit for generating heat based on heater current flowing there through to raise temperature of said timing generator block;

a heater control circuit for detecting an amount of total electric current flowing through the timing generator block, the control logic block, and the heater circuit and providing a control voltage to the heater circuit based on the amount of total electric current detected to control the heater current flowing through the heater circuit through a negative feedback loop;

wherein the heater circuit, the timing generator block and the control logic block are provided within a common CMOS integrated circuit, thereby maintaining constant total electric current in the CMOS integrated circuit;

and wherein the heater circuit is formed of series connected CMOS components each having a terminal for receiving the control voltage to generate said heat and another terminal for receiving a current cut-off voltage to cut off electric current to the heater circuit when quiescent source current of the CMOS integrated circuit is tested.

9. A timing signal generator as defined in claim 8, further comprising a voltage regulator for regulating a source voltage supplied to the CMOS integrated circuit to be a constant value.

10. A timing signal generator as defined in claim 8, wherein the heater circuit includes a plurality of heater blocks which are evenly distributed throughout a whole chip of the CMOS integrated circuit where each heater block includes said CMOS components.

11. A timing signal generator as defined in claim 8, wherein said CMOS components of the heater circuit are distributed only within the control logic block.

12. A timing signal generator as defined in claim 8, wherein the heater control circuit includes a current detection resistor for detecting the total electric current flowing there through, and a differential amplifier provided with a voltage across the current detection resistor at its one input and a reference voltage at its another input, wherein the differential amplifier producing the control voltage supplied to the heater circuit.

* * * * *